United States Patent
Kim

(10) Patent No.: US 10,211,163 B2
(45) Date of Patent: *Feb. 19, 2019

(54) SEMICONDUCTOR PACKAGE AND METHOD OF FABRICATING THE SAME

(71) Applicant: Samsung Electronics Co., Ltd., Suwon-si, Gyeonggi-do (KR)

(72) Inventor: Yeongseok Kim, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 15/895,411

(22) Filed: Feb. 13, 2018

(65) Prior Publication Data

US 2018/0174979 A1 Jun. 21, 2018

Related U.S. Application Data

(63) Continuation of application No. 15/223,577, filed on Jul. 29, 2016, now Pat. No. 9,922,935, which is a
(Continued)

(30) Foreign Application Priority Data

Sep. 17, 2014 (KR) .................. 10-2014-0123776

(51) Int. Cl.
*H01L 23/544* (2006.01)
*H01L 21/56* (2006.01)
(Continued)

(52) U.S. Cl.
CPC .......... *H01L 23/544* (2013.01); *H01L 21/565* (2013.01); *H01L 23/3121* (2013.01);
(Continued)

(58) Field of Classification Search
CPC . H01L 21/565; H01L 23/3121; H01L 23/544; H01L 23/562
(Continued)

(56) References Cited

U.S. PATENT DOCUMENTS

| 4,344,064 A | 8/1982 | Bitler et al. |
| 4,437,229 A | 3/1984 | Bitler et al. |

(Continued)

FOREIGN PATENT DOCUMENTS

| KR | 100283254 | 6/2000 |
| KR | 2003075861 | 9/2003 |

(Continued)

OTHER PUBLICATIONS

"Semiconductor Package and Method for Fabricating the Same" Specification, Drawings, Claims and Prosecution History, of U.S. Appl. No. 14/739,060, filed Jun. 15, 2015, now U.S. Pat. No. 9,418,943, issued on Aug. 16, 2016, by Yeongseok Kim, et al., which is stored in the United states Patent and Trademark Office (USPTO).

(Continued)

*Primary Examiner* — Luan C Thai
(74) *Attorney, Agent, or Firm* — Harnes, Dickey & Pierce, P.L.C.

(57) ABSTRACT

A semiconductor package including a marking film and a method of fabricating the same are provided wherein a marking film including a thermoreactive layer may be applied to a molding layer to protect a semiconductor chip under the molding layer and to efficiently perform a marking process. The thickness of the molding layer may thereby be reduced so the entire thickness of the semiconductor package may be reduced. Also, it is possible to prevent warpage of the semiconductor package through the marking film, provide the surface of the semiconductor package with gloss
(Continued)

and freely adjust the color of the surface of the semiconductor package.

19 Claims, 14 Drawing Sheets

Related U.S. Application Data continuation-in-part of application No. 14/739,060, filed on Jun. 15, 2015, now Pat. No. 9,418,943.

(51) Int. Cl.
*H01L 23/00* (2006.01)
*H01L 23/31* (2006.01)

(52) U.S. Cl.
CPC ............ *H01L 23/562* (2013.01); *H01L 24/13* (2013.01); *H01L 24/16* (2013.01); *H01L 24/29* (2013.01); *H01L 24/32* (2013.01); *H01L 24/48* (2013.01); *H01L 24/73* (2013.01); *H01L 2223/54433* (2013.01); *H01L 2223/54486* (2013.01); *H01L 2224/13101* (2013.01); *H01L 2224/16225* (2013.01); *H01L 2224/2919* (2013.01); *H01L 2224/32225* (2013.01); *H01L 2224/48091* (2013.01); *H01L 2224/48227* (2013.01); *H01L 2224/48472* (2013.01); *H01L 2224/73204* (2013.01); *H01L 2224/73265* (2013.01); *H01L 2924/00014* (2013.01); *H01L 2924/181* (2013.01)

(58) Field of Classification Search
USPC ......................................................... 257/789
See application file for complete search history.

(56) References Cited

U.S. PATENT DOCUMENTS

| | | |
|---|---|---|
| 4,594,263 A | 6/1986 | Folk et al. |
| 4,707,722 A | 11/1987 | Folk et al. |
| 5,011,247 A | 4/1991 | Boudreau et al. |
| 5,164,324 A | 11/1992 | Russell et al. |
| 5,322,988 A | 6/1994 | Russell et al. |
| 5,357,077 A | 10/1994 | Tsurata |
| 5,629,484 A | 5/1997 | Liska |
| 5,759,873 A | 6/1998 | Kata et al. |
| 5,825,022 A | 10/1998 | Takekoshi et al. |
| 5,834,323 A | 11/1998 | Ghafghaichi et al. |
| 5,937,270 A | 8/1999 | Canella |
| 5,952,247 A | 9/1999 | Livengood et al. |
| 5,985,377 A | 11/1999 | Corbett |
| 5,986,235 A | 11/1999 | Canella |
| 6,023,094 A | 2/2000 | Kao et al. |
| 6,075,358 A | 6/2000 | Hetzel et al. |
| 6,087,623 A | 7/2000 | Kwon et al. |
| 6,113,992 A | 9/2000 | Corbett |
| 6,118,540 A | 9/2000 | Roy et al. |
| 6,175,162 B1 | 1/2001 | Kao et al. |
| 6,181,017 B1 | 1/2001 | Hatchard et al. |
| 6,211,484 B1 | 4/2001 | Kaplan et al. |
| 6,339,728 B1 | 1/2002 | Nguyen et al. |
| 6,359,253 B1 | 3/2002 | Sritulanont et al. |
| 6,423,399 B1 | 7/2002 | Endo et al. |
| 6,438,075 B1 | 8/2002 | Takeda et al. |
| 6,537,848 B2 | 3/2003 | Camenforte et al. |
| 6,580,957 B2 | 6/2003 | Canella |
| 6,585,927 B2 | 7/2003 | Grigg et al. |
| 6,589,801 B1 | 7/2003 | Yoon et al. |
| 6,602,734 B1 | 8/2003 | Wada et al. |
| 6,646,671 B1 | 11/2003 | Jitramas et al. |
| 6,692,978 B2 | 2/2004 | Tandy et al. |
| 6,744,125 B2 | 6/2004 | Camenforte et al. |
| 6,806,725 B2 | 10/2004 | Tsui et al. |
| 6,833,619 B1 | 12/2004 | Jang et al. |
| 6,889,902 B2 | 5/2005 | Rumsey |
| 6,919,262 B2 | 7/2005 | Senoo et al. |
| RE38,789 E | 9/2005 | Kao et al. |
| 6,939,501 B2 | 9/2005 | Grigg et al. |
| 6,949,410 B2 | 9/2005 | Joshi et al. |
| 6,972,244 B1 | 12/2005 | Patwardhan et al. |
| 6,979,910 B2 | 12/2005 | Shirasaka |
| 7,029,953 B2 | 4/2006 | Sasaki |
| 7,056,810 B2 | 6/2006 | Yamazaki et al. |
| 7,091,583 B2 | 8/2006 | Chen et al. |
| 7,094,618 B2 | 8/2006 | Tandy et al. |
| 7,094,633 B2 | 8/2006 | Takiar |
| 7,135,356 B2 | 11/2006 | Seddon et al. |
| 7,157,131 B1 | 1/2007 | Blish, II et al. |
| 7,215,011 B2 | 5/2007 | Joshi et al. |
| 7,253,443 B2 | 8/2007 | Yoshida et al. |
| 7,358,119 B2 | 4/2008 | McLellan et al. |
| 7,443,903 B2 | 10/2008 | Leonardo et al. |
| 7,446,942 B2 | 11/2008 | Jacobowitz et al. |
| 7,452,732 B2 | 11/2008 | Corbett |
| 7,503,479 B2 | 3/2009 | Kudo |
| 7,541,294 B2 | 6/2009 | Shirasaka |
| 7,582,954 B1 | 9/2009 | Lim et al. |
| 7,687,923 B2 | 3/2010 | Yang et al. |
| 7,808,709 B2 | 10/2010 | Jacobowitz et al. |
| 7,842,543 B2 | 11/2010 | Wu et al. |
| 7,884,472 B2 | 2/2011 | Chen et al. |
| 7,935,574 B2 | 5/2011 | Saiki et al. |
| 7,956,435 B2 | 6/2011 | Kamimura |
| 7,997,495 B2 | 8/2011 | Rodgers |
| 8,030,138 B1 | 10/2011 | How et al. |
| 8,304,324 B2 | 11/2012 | Huff |
| 8,322,752 B2 | 12/2012 | Sakagami et al. |
| 8,350,377 B2 | 1/2013 | Yang |
| 8,354,749 B2 | 1/2013 | Takiar |
| 8,394,676 B2 | 3/2013 | Yamaji |
| 8,487,212 B2 | 7/2013 | Koops et al. |
| 8,513,816 B2 | 8/2013 | Takamoto et al. |
| 8,597,774 B2 | 12/2013 | Fukue et al. |
| 8,610,294 B2 | 12/2013 | Hasegawa et al. |
| 8,614,139 B2 | 12/2013 | Shishido et al. |
| 8,617,935 B2 | 12/2013 | Xu et al. |
| 8,722,517 B2 | 5/2014 | Takamoto et al. |
| 8,755,121 B2 | 6/2014 | Cape et al. |
| 8,916,416 B2 | 12/2014 | Omandam et al. |
| 9,418,943 B2 * | 8/2016 | Kim ..................... H01L 23/544 |
| 9,922,935 B2 * | 3/2018 | Kim ..................... H01L 23/3121 |
| 2001/0035219 A1 | 11/2001 | Grigg et al. |
| 2002/0098608 A1 | 7/2002 | Tandy et al. |
| 2002/0107603 A1 | 8/2002 | Canella |
| 2002/0137309 A1 | 9/2002 | Senoo et al. |
| 2002/0148897 A1 | 10/2002 | Rumsey |
| 2002/0177875 A1 | 11/2002 | Tsui et al. |
| 2002/0180040 A1 | 12/2002 | Camenforte et al. |
| 2003/0143777 A1 | 7/2003 | Camenforte et al. |
| 2003/0203591 A1 | 10/2003 | Corbett |
| 2004/0000744 A1 | 1/2004 | Grigg et al. |
| 2004/0016930 A1 | 1/2004 | Yoshida et al. |
| 2004/0056364 A1 | 3/2004 | Joshi et al. |
| 2004/0121516 A1 | 6/2004 | Yamazaki et al. |
| 2004/0155324 A1 | 8/2004 | Sasaki |
| 2004/0161876 A1 | 8/2004 | Tandy et al. |
| 2004/0173888 A1 | 9/2004 | Shirasaka |
| 2004/0259291 A1 | 12/2004 | Takiar |
| 2005/0017353 A1 | 1/2005 | Seddon et al. |
| 2005/0051881 A1 | 3/2005 | Chen et al. |
| 2005/0280126 A1 | 12/2005 | Joshi et al. |
| 2006/0060948 A1 | 3/2006 | Shirasaka |
| 2006/0102987 A1 | 5/2006 | Saiki et al. |
| 2006/0154403 A1 | 7/2006 | McLellan et al. |
| 2006/0267165 A1 | 11/2006 | Takiar |
| 2007/0248136 A1 | 10/2007 | Leonardo et al. |
| 2007/0297063 A1 | 12/2007 | Jacobowitz et al. |
| 2008/0083996 A1 | 4/2008 | Kudo |
| 2008/0218869 A1 | 9/2008 | Jacobowitz et al. |
| 2008/0224874 A1 | 9/2008 | Rodgers |
| 2008/0251949 A1 | 10/2008 | Sin et al. |
| 2009/0039497 A1 | 2/2009 | Yang et al. |
| 2009/0053518 A1 | 2/2009 | Saiki et al. |

(56) References Cited

U.S. PATENT DOCUMENTS

| | | |
|---|---|---|
| 2009/0212382 A1 | 8/2009 | Lim et al. |
| 2009/0230539 A1 | 9/2009 | Kamimura |
| 2009/0236739 A1 | 9/2009 | Chen et al. |
| 2009/0286382 A1 | 11/2009 | Huff |
| 2010/0133244 A1 | 6/2010 | Koops et al. |
| 2010/0171214 A1 | 7/2010 | Yamaji |
| 2010/0207283 A1 | 8/2010 | Wu et al. |
| 2010/0301474 A1 | 12/2010 | Yang |
| 2011/0069134 A1 | 3/2011 | Sakagami et al. |
| 2011/0256669 A1 | 10/2011 | Takamoto et al. |
| 2012/0018850 A1 | 1/2012 | Hasegawa et al. |
| 2012/0231236 A1 | 9/2012 | Shishido et al. |
| 2013/0026648 A1 | 1/2013 | Hirano et al. |
| 2013/0052777 A1 | 2/2013 | Xu et al. |
| 2013/0095259 A1 | 4/2013 | Fukue et al. |
| 2013/0099473 A1 | 4/2013 | Harrison et al. |

FOREIGN PATENT DOCUMENTS

| | | |
|---|---|---|
| KR | 10-0480834 | 9/2004 |
| KR | 2004079616 | 9/2004 |
| KR | 10-0632259 | 9/2006 |
| KR | 2007048953 | 5/2007 |

OTHER PUBLICATIONS

Lauren Rougeau, et al., New Irreversible Thermochromic Polydiacetylenes, Tetrahedron, Jun. 11, 2008, 9431-9436. www.elsevier.com/locate/tet.

"Semiconductor Package and Method for Fabricating the Same" Specification, Drawings, Claims and Prosecution History, of U.S. Appl. No. 15/223,577, filed Jul. 29, 2016, by Yeongseok Kim, et al., which is stored in the United states Patent and Trademark Office (USPTO).

* cited by examiner

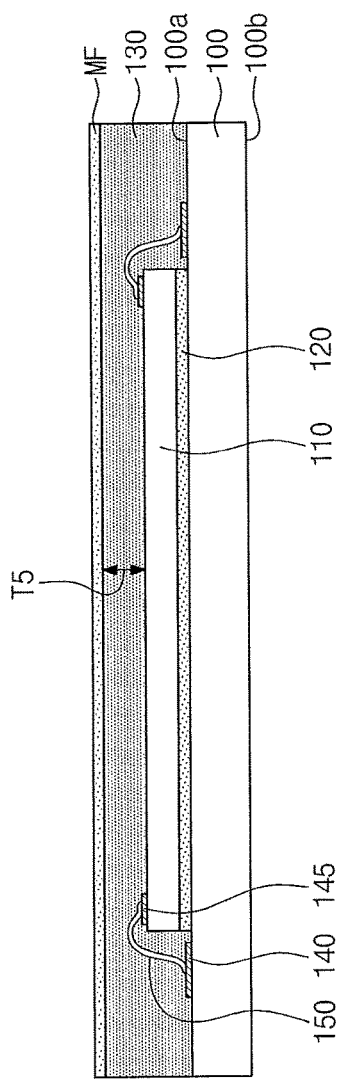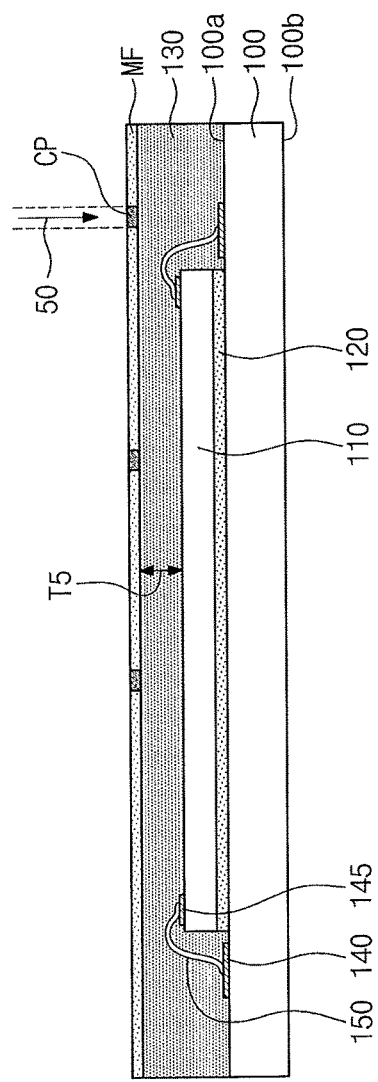

SEMICONDUCTOR PACKAGE AND METHOD OF FABRICATING THE SAME

CROSS-REFERENCE TO RELATED APPLICATIONS

This application is a continuation of U.S. application Ser. No. 15/223,577, filed on Jul. 29, 2016, which is a continuation-in-part of U.S. application Ser. No. 14/739,060, filed on Jun. 15, 2015, now U.S. Pat. No. 9,418,943, issued on Aug. 16, 2016, and claims the benefit of Korean Patent Application No. 10-2014-0123776, filed on Sep. 17, 2014, the entire contents of which are hereby incorporated by reference.

BACKGROUND

The present disclosure herein relates to a semiconductor package and a method of fabricating the same, and more particularly, to a semiconductor package including a marking film and a method of fabricating the same.

A molding layer of a semiconductor package may be included to protect a package substrate and a semiconductor chip mounted thereon. Also, the molding layer may display package information through a marking process using a laser. However, when marking is performed on the surface of the molding layer by using the laser, the semiconductor package may suffer thermal damage caused by the laser. Thus, the molding layer should be made with a sufficient thickness to protect the package substrate and the semiconductor chip. It is typically desirable, however, to use a thinner molding layer while still sufficiently protecting the package substrate.

SUMMARY

The present disclosure provides a semiconductor package that may efficiently perform a marking process and also decrease the needed thickness of a molding layer.

The present disclosure also provides a method of fabricating a semiconductor package that may be efficiently subjected to a marking process while also employing a thinner molding layer.

Embodiments of the inventive concept provide semiconductor packages including: a package substrate on which a semiconductor chip is mounted; a molding layer covering the package substrate; and a marking film disposed on the molding layer, wherein the marking film includes a thermoreactive layer that reacts to an electromagnetic wave.

In some embodiments, the electromagnetic wave may include a laser, an ultraviolet ray or a combination of the laser and the ultraviolet ray, the thermoreactive layer may include a discoloration material selected from a group consisting of thermochromic material, photochromic material, ionochromic material, electrochromic material, solvatochromic material, piezochromic material, gasochromic material, vapochromic material and chronochromic material, and a carbonization material selected from a carbonizable polymer group, the discoloration material is discolored by reaction with the electromagnetic wave, and the carbonization material is carbonized by reaction with the electromagnetic wave.

In other embodiments, the thermoreactive layer may further include reflectors that reflect the electromagnetic wave, and the discoloration material or carbonization material may have a crystal structure including crystal grains, wherein the reflectors may be dispersed in a space between the crystal grains.

In still other embodiments, the thermochromic material or photochromic material may include leuco dye.

In even other embodiments, the thermoreactive layer may further include reinforcements that enhance the strength of the marking film.

In yet other embodiments, the marking film may further include a reflection layer between the thermoreactive layer and the molding layer, wherein the reflection layer may include reflectors that reflect the electromagnetic wave.

In further embodiments, a thickness of the marking film may be about 5 µm to about 40 µm.

In still further embodiments, the semiconductor package may further include wires electrically connecting the semiconductor chip to the package substrate, wherein the molding layer may cover the semiconductor chip and the wires, and wherein a distance between a top surface of the molding layer and a top surface of the semiconductor chip may be about 50 µm to about 150 µm.

In even further embodiments, the semiconductor package may further include connection members interposed between the semiconductor chip and the package substrate to electrically connect the semiconductor chip to the package substrate, wherein the molding layer may cover the semiconductor chip and the connection members, and wherein a distance between a top surface of the molding layer and a top surface of the semiconductor chip may be about 1 µm to about 40 µm.

In other embodiments of the inventive concept, methods of fabricating a semiconductor package include: providing a package substrate on which a semiconductor chip is mounted; forming a molding layer molding the semiconductor chip; and forming a marking film that includes a thermoreactive layer on the molding layer, wherein the thermoreactive layer reacts to an electromagnetic wave.

In some embodiments, the step of forming the molding layer may include: providing the package substrate on a lower mold; and providing a molding resin between an upper mold and the lower mold.

In other embodiments, the step of forming the marking film may include: providing a package film under an upper mold, wherein the package film may include the marking film and a base film that are sequentially stacked; and separating the upper mold and the base film from the molding layer after the forming of the molding layer, wherein the marking film may remain on the molding layer.

In still other embodiments, a base film may include a release layer in contact with the marking film, and the base film can be separated from the marking film through the release layer.

In even other embodiments, the step of providing the package substrate may include forming wires electrically connecting the semiconductor chip to the package substrate before forming the molding layer, wherein the molding layer may cover the semiconductor chip and the wires, and wherein a distance between a top surface of the molding layer and a top surface of the semiconductor chip may be about 50 µm to about 150 µm.

In yet other embodiments, the step of providing the package substrate may include forming connection members between the semiconductor chip and the package substrate to electrically connect the semiconductor chip to the package substrate before forming the molding layer, wherein a distance between a top surface of the molding layer and a top surface of the semiconductor chip may be about 1 µm to about 40 µm.

In an aspect, embodiments of this invention include a semiconductor package comprising: a package substrate on which a semiconductor chip is mounted; a molding layer that covers the package substrate and molds the semiconductor chip; and a marking film disposed on the molding layer, wherein the marking film comprises a thermoreactive layer that reacts to an electromagnetic wave.

In some embodiments the electromagnetic wave comprises a laser, an ultraviolet ray or a combination of the laser and the ultraviolet ray, and the thermoreactive layer comprises a thermochromic material or photochromic material that reacts to the electromagnetic wave.

In some embodiments the thermoreactive layer further comprises reflectors consisting of reflector material that reflects the electromagnetic wave, the thermochromic material or photochromic material has a crystal structure comprising crystal grains, and the reflectors are dispersed in a space between the crystal grains.

In some embodiments the thermochromic material or photochromic material comprises a leuco dye.

In some embodiments the thermoreactive layer further comprises reinforcement material enhancing the strength of the marking film.

In some embodiments the marking film further comprises a reflection layer between the thermoreactive layer and the molding layer, wherein the reflection layer comprises reflectors consisting of reflector material that reflects the electromagnetic wave.

In some embodiments a thickness of the marking film is about 5 µm to about 40 µm.

In some embodiments the semiconductor package further comprises one or more wires electrically connecting the semiconductor chip to the package substrate, wherein the molding layer covers the semiconductor chip and the wires, and wherein a distance between a top surface of the molding layer and a top surface of the semiconductor chip is about 50 µm to about 150 µm.

In some embodiments the semiconductor package further comprises connection members interposed between the semiconductor chip and the package substrate to electrically connect the semiconductor chip to the package substrate, wherein the molding layer covers the semiconductor chip and the connection members, and wherein a distance between a top surface of the molding layer and a top surface of the semiconductor chip is about 1 µm to about 40 µm.

In another aspect embodiments of this invention comprise a method of fabricating a semiconductor package, the method comprising: providing a package substrate on which a semiconductor chip is mounted; forming a molding layer covering the package substrate and molding the semiconductor chip; and forming a marking film comprising a thermoreactive layer on the molding layer, wherein the thermoreactive layer reacts to an electromagnetic wave.

In some embodiments the step of forming the molding layer comprises: providing the package substrate on a lower mold; and providing a molding resin between an upper mold and the lower mold.

In some embodiments the step of forming the marking film comprises: providing a package film under the upper mold, wherein the package film comprises the marking film and a base film that are sequentially stacked; and separating the upper mold and the base film from the molding layer after the forming of the molding layer, wherein the marking film remains on the molding layer.

In some embodiments the base film comprises a release layer in contact with the marking film, and the base film is separated from the marking film through the release layer.

In some embodiments the step of providing the package substrate includes forming wires electrically connecting the semiconductor chip to the package substrate before the step of forming the molding layer, wherein the molding layer covers the semiconductor chip and the wires, and wherein a distance between a top surface of the molding layer and a top surface of the semiconductor chip is about 50 µm to about 150 µm.

In some embodiments the step of providing the package substrate comprises forming connection members that extend between the semiconductor chip and the package substrate to electrically connect the semiconductor chip to the package substrate before the step of forming the molding layer, wherein a distance between a top surface of the molding layer and a top surface of the semiconductor chip is about 1 µm to about 40 µm.

In another aspect the semiconductor package comprises a package substrate on which a semiconductor chip is mounted; a molding layer that covers the package substrate and molds the semiconductor chip; and a marking film disposed on the molding layer, wherein the marking film comprises a thermoreactive layer that reacts to an electromagnetic wave and reflectors consisting of reflector material that reflects the electromagnetic wave.

In some embodiments the reflectors are in a reflection layer between the thermoreactive layer of the marking film and the molding layer.

In some embodiments the reflection layer further comprises an adhesive material.

In some embodiments the reflectors are included in the thermoreactive layer of the marking film.

In some embodiments the reflector material is selected from the group consisting of $Sb_2O_3$, $BaSO_4$, $(PbCO_3)_2 \cdot Pb(OH)_2$, $TiO_2$, $ZnO$, $ZnS$, $Al_2O_3$, $SiO_2$ or mixtures thereof.

BRIEF DESCRIPTION OF THE DRAWINGS

The accompanying drawings are included to provide a further understanding of the inventive concept, and are incorporated in and constitute a part of this specification. The drawings illustrate exemplary embodiments of the inventive concept and, together with the description, serve to explain principles of the inventive concept. In the drawings:

FIGS. 6A to 6E are schematic cross-sectional views of a semiconductor package sequentially representing a method of fabricating a semiconductor package according to an embodiment of the inventive concept;

DETAILED DESCRIPTION OF THE EMBODIMENTS

Figure 1:
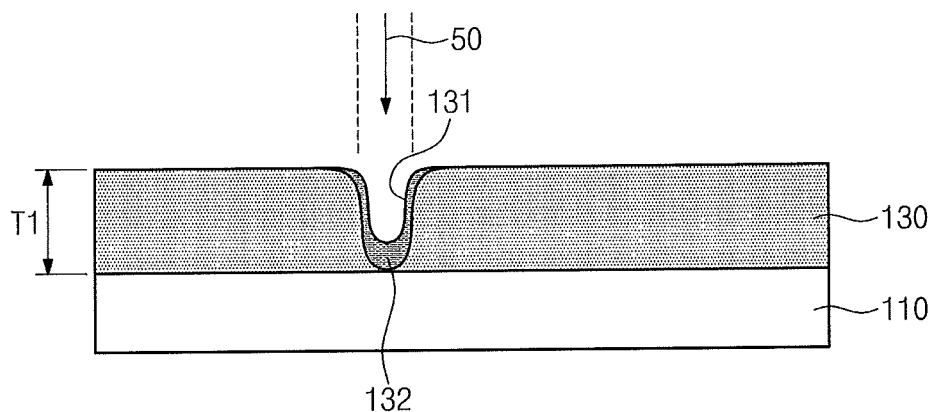
FIG. 1 is a schematic cross-sectional view of a semiconductor package representing a general marking process.

In order for the readers to sufficiently understand the configuration and effect of the inventive concept, exemplary embodiments of the inventive concept are described with reference to the accompanying drawings. The inventive concept may, however, be embodied in different forms and should not be construed as limited to the embodiments set forth herein. The embodiments are provided to make the disclosure of the inventive concept complete and to completely inform a person skilled in the art of the scope of the inventive concept.

It will also be understood that when a layer (or film) is referred to as being 'on' another layer or substrate, it can be directly on the other layer or substrate, or intervening layers may also be present. In the accompanying drawings, the dimensions of layers and regions may be exaggerated for clarity of illustration. Like reference numerals refer to like elements throughout.

Embodiments in the present disclosure are described with reference to ideal, exemplary cross-sectional views and/or plan views of the inventive concept. The thicknesses of layers and regions in the drawings may be exaggerated for the effective description of technical content. Thus, regions illustrated in the drawings are exemplary, and the shapes of the regions illustrated in the drawings are intended to illustrate the specific shapes of the regions of elements and not to limit the scope of the inventive concept. Although terms like a first, a second, a third, etc. are used to describe various elements in various embodiments of the present disclosure, these elements are not limited to these terms. These terms are only used in order to distinguish an element from another element. Embodiments that are described and illustrated herein also include their complementary embodiments.

The terms used herein are only for explaining embodiments while not limiting the inventive concept. The terms in a singular form in the disclosure may also include plural forms unless otherwise specified. The term 'comprises' and/or 'comprising' used in the disclosure does not exclude the existence or addition of one or more additional components.

FIG. 1 is a sectional view of a semiconductor package representing a general marking process.

Referring to FIG. 1, a semiconductor chip 110 and a molding layer 130 molding the semiconductor chip 110 may be provided. FIG. 1 represents only a portion of a cross-sectional view of a general semiconductor package, and a description regarding the semiconductor chip 110 and the molding layer 130 will be mainly provided below. The semiconductor chip 110 may be a memory or non-memory device. As an example, the semiconductor chip 110 may be a dynamic random access memory (DRAM) or a flash memory element. The molding layer 130 may be formed with a first thickness T1 on the semiconductor chip 110. In particular, the first thickness T1 may be a distance from a top surface of the molding layer 130 to a top surface of the semiconductor chip 110. The molding layer 130 may be formed by using an epoxy molding compound (EMC) as a molding resin.

A marking process may be performed on the molding layer 130. The marking process may be a process that forms a part that displays information on a semiconductor package on the molding layer 130. The marking process may implement the information display part in a different color from the molding layer 130 so that a user may identify the information display part. In general, the marking process may be performed by using a laser or an ink jet; and, FIG. 1 illustrates a marking process using a laser 50.

When the laser 50 is irradiated directly onto the molding layer 130, the molding layer 130 is partially melted by the laser 50 and thus a recess region 131 may be formed. Also, a thermal deformation region 132 may be formed around the recess region 131 by the energy of the laser 50. When the first thickness T1 of molding layer 130 is not sufficiently thick, the semiconductor chip 110 may also be damaged due to the laser 50.

In order to prevent damage to the semiconductor chip 110, the first thickness T1 may be generally about 110 μm. When a wire (not shown) that electrically connects the semiconductor chip 110 to the package substrate (not shown) is disposed through the structure, the first thickness T1 may need to be increased in order to prevent damage to the wire. In this case, for example, the first thickness T1 may need to be about 150 μm. Thus, when the laser 50 is directly radiated onto the molding layer 130 in the marking process, there may be a limitation because the thickness of the molding layer 130 may need to be increased resulting in an increased thickness of the package.

Figure 2:
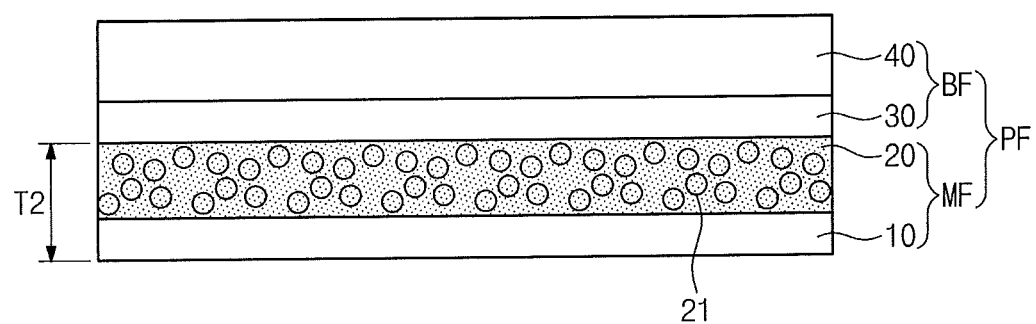
FIG. 2 is a schematic cross-sectional view of a package film according to embodiments of the inventive concept.

FIG. 2 is a cross-sectional view of a package film PF according to embodiments of the inventive concept.

Referring to FIG. 2, a package film PF may include a marking film MF and a base film BF that are sequentially stacked. The marking film MF may include a reflection layer 10, and a thermoreactive layer 20 disposed on the reflection layer 10. The base film BF may include a release layer 30 disposed on the thermoreactive layer 20 and a base layer 40 disposed on the release layer 30.

The reflection layer 10 may include reflection material (reflectors) that reflects an electromagnetic wave. The electromagnetic wave may be a laser or an ultraviolet ray. A laser 50 is illustrated in embodiments of the inventive concept (see, e.g., FIG. 3B). The reflection layer 10 may reflect the laser 50 entering through the thermoreactive layer 20 so that the laser fails to pass the reflection layer 10. As an example, the reflectors used in the reflection layer 10 may include $Sb_2O_3$, $BaSO_4$, $(PbCO_3)_2 \cdot Pb(OH)_2$, $TiO_2$, $ZnO$, $ZnS$, $Al_2O_3$, $SiO_2$ or mixtures thereof. Furthermore, the reflection layer 10 may further include an adhesive material. Accordingly, the reflection layer 10 may also function as an adhesion layer.

The thermoreactive layer 20 may include a discoloration material and/or carbonization material that reacts to the electromagnetic wave. The thermoreactive layer may include a carbonizable polymer and a light absorber, and the carbonizable polymer may be selected from the group consisting of acrylic, phenolic, epoxy, urethane, polyamide and polyolefin, and the light absorber may be selected from the group consisting of a carbon black, titanium black, $Fe_3O_4$, and a mordant black. The discoloration material may be selected from a group consisting of thermochromic material, photochromic material, ionochromic material, electrochromic material, solvatochromic material, piezochromic material, gasochromic material, vapochromic material and chronochromic material. For example, the thermochromic material or photochromic material may include a leuco dye. The thermochromic material is a conjugated system of an electron donating material or electron accepting material that may change a structure at a specific temperature (for example, at room temperature) to a color. The thermochromic material reversibly develops a color in some cases. Furthermore, the thermochromic material may also be induced into irreversible color development through a color developer and a sensitizer or through an additional reaction.

The leuco dye may include a xanthene leuco dye, a thioxanthene leuco dye, an acridine leuco dye, a phenoxazine leuco dye, a phenazine leuco dye, a merocyanine leuco dye, a thiazine leuco dye, an oxazine leuco dye, an azine leuco dye, a methane leuco dye, an azo leuco dye, a pyrazoline leuco dye, a stilbene leuco dye, a coumarin leuco dye, a triarylmethane leuco dye, a spiropyran leuco dye, a phthalide leuco dye, a fluoran leuco dye, an acyl leuco dye, an auramine leuco dye, a rhodamine-lactam leuco dye, a chromene leuco dye, a quinine leuco dye, an amino hydrocinnamic acid leuco dye, a 2-(p-hydroxyphenyl)-4,5-diphenylimidazole leuco dye, an indanone leuco dye, an indamine leuco dye, a hydrazine leuco dye, an indigoid leuco dye, an amino-2,3-dihydroanthraquinone leuco dye, a tetrahalo-p,p'-biphenol leuco dye, a phenylethyl aniline leuco dye, or mixtures thereof.

Furthermore, the ionochromic material may include phthalides, leucotriarylmethanes, azo dyes, styryl dyes, chelates, crown ethers, sulfones, mono- and di-vinylphthalides, and lactams. The electrochromic material may include tungsten trioxide or molybdenum trioxide. The solvatochromic material may include pyridinium phenol betaine. The piezochromic material may include cholesterol ester. The gasochromic material may include tungsten oxide, tungstate, nioboxide, molybden oxide, molybtate, nickel oxide, titanium oxide, banadium oxide, iridium oxide, manganese oxide or cobalt oxide. The vapochromic material may include tetra-alkyl metallo porphyrins with para substituents.

The carbonization material may be selected from a carbonizable polymer group which can be carbonized by reaction with the electromagnetic wave. For example, the carbonizable polymer group may include any polymers that can be decomposed by heat (at temperatures below about 600° C.). The carbonizable polymer may include a polyamide, a copolyaramide, a para-aramide, a polyaramide, a phenolic resin, a polyester, or a cellulose and is not limited thereto.

The thermoreactive layer 20 may further include a color developer to develop various colors. The color developer may include crystal violet lactone, malachite green lactone, a bis-indolyl phthalide dye, a diamino fluoran dye or a xanthene dye. By freely adjusting the color of the thermoreactive layer 20 through the color developer, it is possible to provide a user with desirable aesthetic features.

The thermoreactive layer 20 may further include a light stabilizer and/or a sensitizer. It is possible to increase the stability of the thermochromic and/or the photochromic material by including a light stabilizer. It is possible to adjust the color developing temperature of the thermoreactive layer 20, or to increase discoloration efficiency, by including a sensitizer.

In the present embodiment, the discoloration material or carbonization material may have a crystal structure that includes first crystal grains 21. The first crystal grains 21 may be substantially evenly dispersed through the thermoreactive layer 20.

As an example, the thermoreactive layer 20 may have surface gloss through the thermochromic material and/or the photochromic material. As another example, the thermoreactive layer 20 may have a glossy surface by further including gloss. Furthermore, the thermoreactive layer 20 may further include a reinforcement material. Accordingly, it is possible to enhance the mechanical strength (such as tensile strength) of the marking film MF. As an example, the reinforcement material may be glass fiber. As another example, the marking film MF may further include a reinforcement layer (not shown) for enhancing mechanical strength and the reinforcement material may be included in the reinforcement layer.

The sum of the thicknesses of the reflection layer 10 and the thermoreactive layer 20, i.e., the overall thickness of the marking film MF, may be a second thickness T2. As an example, the second thickness T2 may be about 5 μm to about 40 μm. The reflection layer 10 and the thermoreactive layer 20 may be formed by using a thermosetting resin. As an example, the thermosetting resin may be a phenol resin, a urea resin, a melamine resin, an epoxy resin, a polyester resin or mixtures thereof.

The release layer 30 may enable the base film BF to be separated from the marking film MF. The release layer 30 may include a silicone release agent, an epoxy release agent, or a fluorine release agent and is not limited thereto.

The base layer 40 may support the whole of the package film PF. As an example, the base film BF may be formed of, but not limited to, fluorocarbon, polyethylene terephthalate, polyethylene, polypropylene, poly methyl methacrylate, polycarbonate, polyurethane or mixtures thereof. In another embodiment, although not shown, the release layer 30 may be omitted. For example, the base layer 40 may include Ethylene TetrafluoroEthylene (ETFE) thereby having a releasing property without the release layer 30.

The package film PF according to the present embodiment may be applied onto the semiconductor package. In this case, the marking film MF may be transferred from the package film PF onto the semiconductor package. Related descriptions are provided below.

Figure 3A:
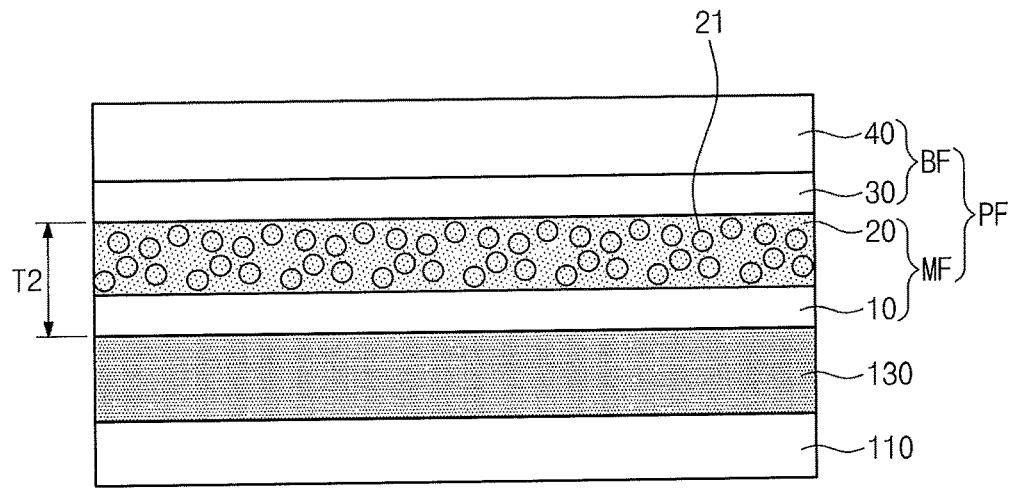
FIGS. 3A and 3B are schematic cross-sectional views of a semiconductor package sequentially representing a marking process according to embodiments of the inventive concept.
Figure 3B:
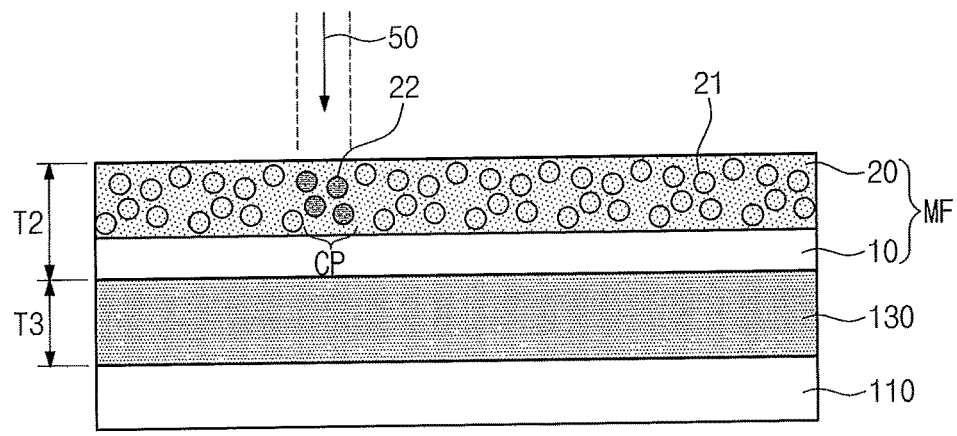

FIGS. 3A and 3B are cross-sectional views of a semiconductor package sequentially representing a marking process according to embodiments of the inventive concept.

Referring to FIG. 3A, a semiconductor chip 110 and a molding layer 130 molding the semiconductor chip 110 may be provided. It should be understood that FIGS. 3A and 3B represent only a portion of a cross-sectional view of a semiconductor package according to the embodiments of the inventive concept, and the semiconductor chip 110 and the molding layer 130 are mainly described. Descriptions of the semiconductor chip 110 and the molding layer 130 may be similar to those described above with reference to FIG. 1.

The package film PF as described with reference to FIG. 2 above may be provided on the molding layer 130. Since the reflection layer 10 may include an adhesive material, the package film PF may be in contact with a top surface of the molding layer 130 through the reflection layer 10.

Referring to FIG. 3B, the base film BF of the package film PF may be separated from the marking film MF. That is, the marking film MF may be transferred onto the molding layer 130. In particular, the base film BF may be easily separated from the marking film MF through the release layer 30 of the base film BF.

Then, an electromagnetic wave may be irradiated onto the marking film MF. As an example, the electromagnetic wave may be the laser 50 (as shown in FIG. 3B). The thermochromic material and/or the photochromic material under a region which is irradiated by the laser 50 may be discolored by reaction with the laser 50. That is, discoloration crystal grains may be formed from the first crystal grains 21. Accordingly, a discoloration region CP that a user may identify may be formed in the thermoreactive layer 20. Although not shown in FIG. 3B, the discoloration region CP may display information on the semiconductor package from a planar view. When the laser 50 is used, it is possible to easily form the discoloration region CP because it is possible to transfer electromagnetic energy only to a specific region of the marking film MF.

The laser 50 radiation induces the reaction of the thermoreactive layer 20, as described above, but it is reflected by the reflection layer 10 and thus may not pass through the reflection layer 10. Thus, the energy of the laser 50 may not be transferred through the molding layer 130 to the semiconductor chip 110. The molding layer 130 of the present embodiment may be formed with a third thickness T3 which may be smaller than the first thickness T1 as described in FIG. 1. That is, because only the thermoreactive layer 20 of the marking film MF suffers damage by the laser 50, unlike what is illustrated in FIG. 1, the third thickness T3 of the molding layer may be reduced because a thicker molding layer is not needed to protect the semiconductor chip 110.

In particular, the third thickness T3 may be a distance from a top surface of the molding layer 130 to a top surface of the semiconductor chip 110. As an example, the third thickness T3 may be about 1 μm to about 40 μm. When a wire (not shown) that electrically connects the semiconductor chip 110 to the package substrate (not shown) is disposed through the structure, the third thickness T3 may need to increase somewhat in order to prevent damage to the wire. In this case, the third thickness T3 may be about 50 μm to about 150 μm. That is, the thickness of the molding layer 130 in a semiconductor package according to the present embodiment may be advantageously reduced when compared to the thickness of the molding layer 130 of a general semiconductor package as described with reference to FIG. 1.

The semiconductor package according to the present embodiment may apply the marking film MF to the molding layer 130 to protect the semiconductor chip 110 and to efficiently perform a marking process. Since the thickness of the molding layer 130 can be decreased (relative to the FIG. 1 device), the entire thickness of the semiconductor may be further decreased. Also, by increasing the thickness of the thermoreactive layer 20 or by adding reinforcements thereto, the thermoreactive layer 20 may increase the mechanical strength of the marking film MF. Accordingly, the marking film MF can prevent warpage of the semiconductor package. Also, by adjusting the theimochromic material and/or photochromic material in the thermoreactive layer 20, it is possible to provide the surface of the semiconductor package with gloss, and it is also possible to freely adjust the color of the discoloration region CP. Thus, it is also possible to provide a user with desirable aesthetic features.

Figure 4:
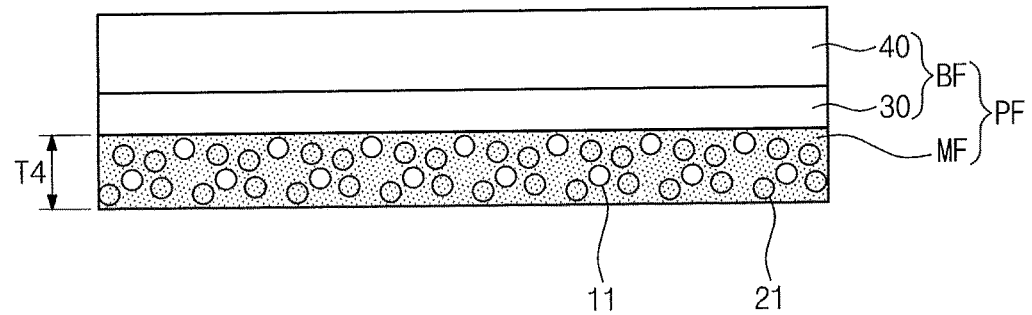
FIG. 4 is a schematic cross-sectional view of a package film according to other embodiments of the inventive concept.

FIG. 4 is a cross-sectional view of the package film PF according to other embodiments of the inventive concept. In the present (FIG. 4) embodiment, detailed descriptions of technical characteristics that overlap those described with reference to FIG. 2 are omitted and only differences are described in detail. The same reference numerals may be provided for the same components as those in the package film PF for describing the inventive concept and the foregoing embodiment.

Referring to FIG. 4, a package film PF may include a marking film MF and a base film BF that are sequentially stacked. The marking film MF may be a single layer that includes a thermoreactive layer 20. That is, the reflection layer 10 (as seen in FIG. 2) may not be provided in this embodiment of the inventive concept. The base film BF may include a release layer 30 disposed on the marking film MF and a base layer 40 disposed on the release layer 30.

The marking film MF of FIG. 4 may further include reflectors that reflect electromagnetic waves. The reflectors may reflect the electromagnetic waves entering through the marking film MF so that they do not completely pass through the marking film MF. As an example, the reflectors may include $Sb_2O_3$, $BaSO_4$, $(PbCO_3)_2 \cdot Pb(OH)_2$, $TiO_2$, ZnO, ZnS, $Al_2O_3$, $SiO_2$ or mixtures thereof.

The thermochromic material and/or the photochromic material in the marking film MF may have a crystal structure that includes first crystal grains 21. Also, the reflectors may have a crystal structure that includes second crystal grains 11 that are different from first crystal grains 21. In this case, the first crystal grains 21 have spaces therebetween and may be substantially evenly dispersed through the marking film MF, and the second crystal grains 11 may be dispersed in those spaces.

In the present (FIG. 4) embodiment, the thermoreactive layer 20 and the reflection layer 10 as described with reference to FIG. 2 may be integrated to configure the marking film MF in a single layer. As a result of this integration of layers, the marking film MF may be further reduced in thickness. In particular, the marking film MF of FIG. 4 may have a fourth thickness T4. The fourth thickness T4 may be about 5 μm to about 30 μm.

Figure 5A:
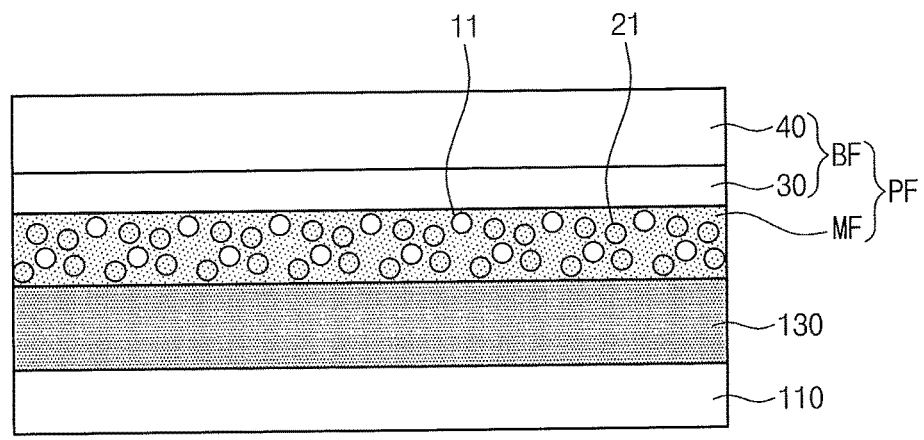
FIGS. 5A and 5B are schematic cross-sectional views of a semiconductor package sequentially representing a marking process according to other embodiments of the inventive concept.
Figure 5B:
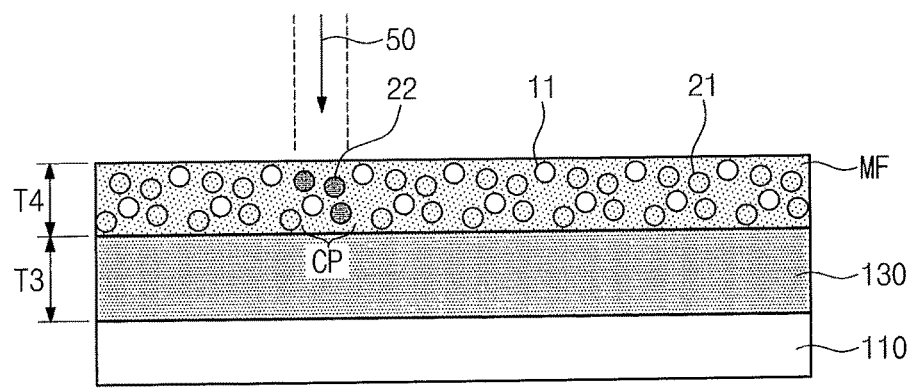

FIGS. 5A and 5B are cross-sectional views of a semiconductor package sequentially representing a marking process according to other embodiments of the inventive concept. In the present (FIG. 5A/5B) embodiment, detailed descriptions of technical characteristics that overlap those described with reference to FIGS. 3A and 3B are omitted and only differences are described in detail. The same reference numerals may be provided for the same components as those in the semiconductor package for describing the inventive concept and the foregoing embodiment.

Referring to FIG. 5A, a semiconductor chip 110 and a molding layer 130 molding the semiconductor chip 110 may be provided. Similar to FIGS. 3A and 3B, it will be understood that FIGS. 5A and 5B represent only a portion of a cross-sectional view of a semiconductor package according to other embodiments of the inventive concept and the semiconductor chip 110 and the molding layer 130 are mainly described. Descriptions of the semiconductor chip 110 and the molding layer 130 may be similar to those described above with reference to FIG. 1.

The package film PF as described with reference to FIG. 4 above may be provided on the molding layer 130. The package film PF may adhere to a top surface of the molding layer 130 through the marking film MF.

Referring to FIG. 5B, the base film BF of the package film PF may be separated from the marking film MF. Then, an electromagnetic wave may be irradiated onto the marking film MF. As an example, the electromagnetic wave may be the laser 50 (as shown in FIG. 5B). Discoloration crystal grains may be formed from the first crystal grains 21 under a region which is irradiated by the laser 50. Accordingly, a discoloration region CP that a user may identify may be formed in the marking film MF.

The laser 50 radiation may be reflected by the second crystal grains 11 of reflector material in the marking film MF and thus may not completely pass through the marking film MF. Thus, the energy of the laser 50 may not be transferred through the molding layer 130 to the semiconductor chip 110.

FIGS. 6A to 6E are cross-sectional views of a semiconductor package sequentially representing a method of fabricating a semiconductor package according to an embodiment of the inventive concept. FIGS. 6A to 6E show an exemplary embodiment wherein a package substrate 100 with a single semiconductor chip mounted thereon is shown due to a restriction in the size of the drawing. It will be understood, however, that the inventive concept may also be equally applied to the package substrate 100 on which a plurality of semiconductor chips are mounted. In this case, the semiconductor package may be finally fabricated through a cutting process.

Figure 6A:
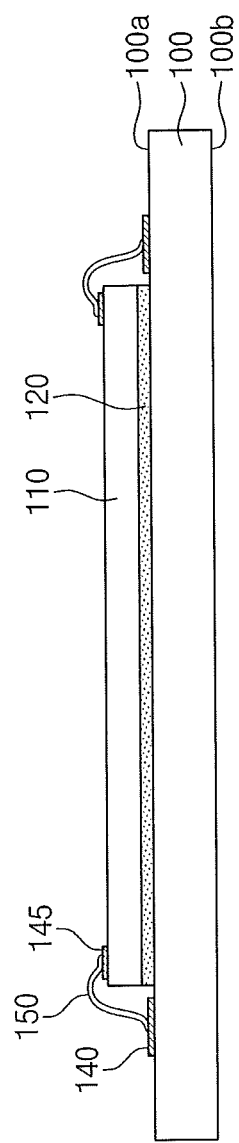

Referring to FIG. 6A, the package substrate 100 on which the semiconductor chip 110 is mounted may be provided. The package substrate 100 may include a top surface 100a and a bottom surface 100b that are opposed to each other. The package substrate 100 may be a single-layered or multi-layered printed circuit board (PCB) or ceramic substrate. Although not shown, a wire pattern (not shown) formed of copper and upper terminals 140 may be formed inside the package substrate 100 and on a surface of the package substrate 100. The upper terminals 140 may be formed on the top surface 100a. Furthermore, a protective layer (not shown) may be formed which surrounds the top surface 100a and the bottom surface 100b of the package substrate 100 and protects the wire pattern (not shown) and the upper terminals 140.

The semiconductor chip 110 may be mounted so that the bottom surface thereof faces the top surface 100a of the package substrate 100. The semiconductor chip 110 may be a memory or non-memory element. As an example, the semiconductor chip 110 may be a DRAM or flash memory element.

Chip connection terminals 145 may be disposed on a top surface of the semiconductor chip 110. In the present embodiment, the semiconductor chip 110 may be mounted on the package substrate 100 by using a wire bonding technique. Accordingly, the chip connection terminals 145 may be connected to the upper terminals 140 by wires 150. An underfill resin layer 120 may be filled between the semiconductor chip 110 and the package substrate 100.

Figure 6B:
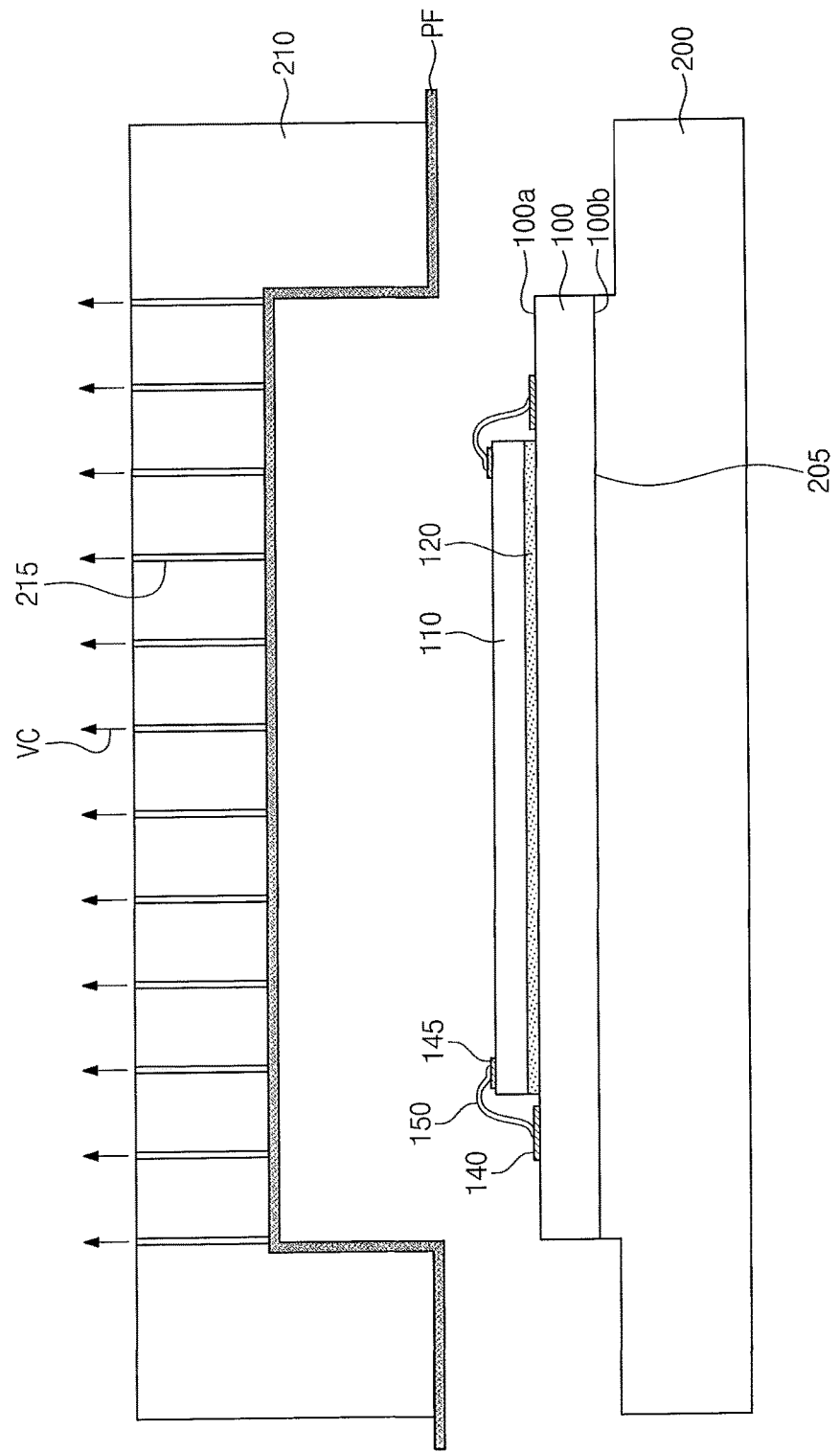

Referring to FIG. 6B, the package substrate 100 on which the semiconductor chip 110 is mounted may be provided on a lower mold 200. The package substrate 100 may be disposed on a projecting mounting portion 205 of lower mold 200.

A package film PF may be provided under an upper mold 210. The package film PF may be the same as the package film PF as described above in connection with FIG. 2 or FIG. 4. The package film PF may include a base film BF and a marking film MF. The upper mold 210 may include decompression portions 215. A vacuum VC may be applied to the upper mold 210 through the decompression portions 215. In detail, a heat treatment (not shown) may be performed on the package film PF that is provided under the upper mold 210. The package film PF may be deformed through the heat treatment, in which case the package film PF may surround an internal sidewall of the upper mold 210 by the vacuum VC.

Figure 6C:
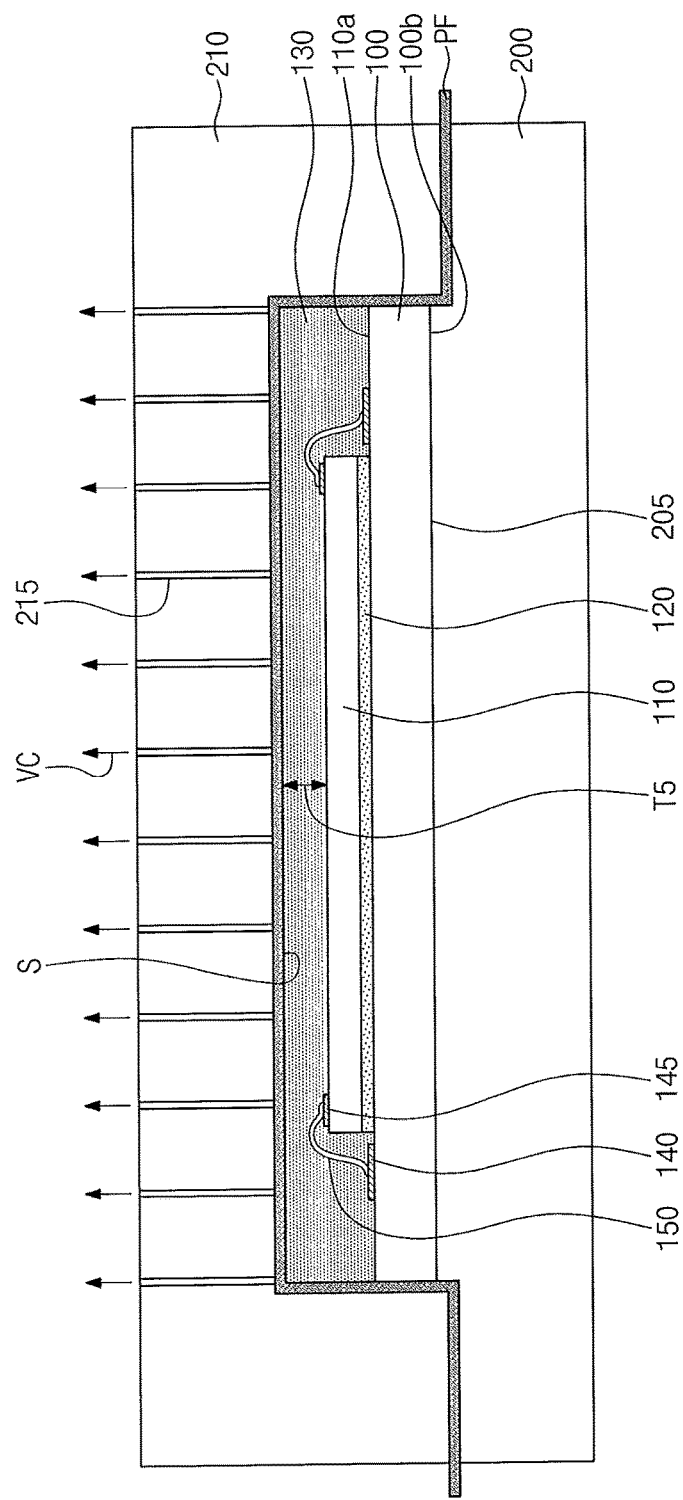

Referring to FIG. 6C, the upper mold 210 may be combined with the lower mold 200. Together with this combination step, a molding layer 130 may be formed which covers the package substrate 100 and molds the semiconductor chip 110. In detail, a molding resin may be provided in an internal space S that is formed by the combination of the upper mold 210 and the lower mold 200. As an example, the molding resin may be EMC. The molding resin may be provided in the internal space S because the internal space S is decompressed due to the vacuum VC provided in the upper mold 210. The molding layer 130 may be formed to have a fifth thickness T5. The fifth thickness T5 may be a distance from a top surface of the molding layer 130 to a top surface of the semiconductor chip 110 of about 50 µm to about 150 µm.

Referring to FIG. 6D, the upper mold 210 and the lower mold 200 (as seen in FIG. 6C) may be separated from the package substrate 100. The base film portion BF of the package film PF may be separated from the molding layer 130 simultaneously with the separation of the upper mold 210. Accordingly, the marking film MF may be formed on the molding layer 130. In detail, the base film BF is separated from the marking film MF through the release layer 30 under the base film BF (see FIGS. 2 and 4), and the marking film may remain on the molding layer 130, as described with reference to FIG. 3B or FIG. 5B above.

Referring to FIG. 6E, discoloration regions CP may be formed by irradiating a laser 50 onto the marking film MF. As described with reference to FIG. 3B or FIG. 5B, the thermoreactive layer 20 in the marking film MF may include a thermochromic material and/or a photochromic material. The thermochromic material and/or the photochromic material under a region which is irradiated by the laser 50 may be discolored by reaction with the laser 50. Accordingly, the discoloration regions CP that a user may identify may be formed in the marking film MF. Although not shown, the discoloration regions CP may display information on the semiconductor package from a planar view.

FIG. 6E is a cross-sectional view of a semiconductor package according to an embodiment of the inventive concept.

Referring to FIG. 6E, a semiconductor chip 110 may be mounted on a package substrate 100. A molding layer 130 may be disposed which covers the package substrate 100 and molds the semiconductor chip 110. An underfill resin layer 120 may be filled between the semiconductor chip 110 and the package substrate 100. Wires 150 may electrically connect the package substrate 100 to the semiconductor chip 110. Detailed descriptions of the package substrate 100, the semiconductor chip 110, the underfill resin layer 120, and the wires 150 may be the same as those described above with reference to FIG. 6A.

The molding layer 130 may be formed of EMC. The molding layer 130 may have a fifth thickness T5. In detail, the fifth thickness T5 may be a distance from a top surface of the molding layer 130 to a top surface of the semiconductor chip 110 of about 50 µm to about 150 µm.

A marking film MF may be disposed on the molding layer 130. The marking film MF may be the same as the marking film MF of the package film PF as described above with reference to FIG. 2 or FIG. 4. A thermoreactive layer 20 in the marking film MF may include a thermochromic material and/or a photochromic material. The thermochromic material and/or the photochromic material under a region which is irradiated by the laser 50 may be discolored by reaction with the laser 50. Accordingly, the marking film MF may include discoloration regions CP that a user may identify.

FIGS. 7A to 7E are cross-sectional views of a semiconductor package sequentially representing a method of fabricating a semiconductor package according to another embodiment of the inventive concept. In the FIGS. 7A to 7E embodiment, detailed descriptions of technical characteristics that overlap with those described above with reference to FIGS. 6A to 6E are omitted and only differences are described in detail. The same reference numeral may be provided for the same components as those in the method of fabricating the semiconductor package and for describing the inventive concept of the foregoing embodiment.

FIGS. 7A to 7E show an exemplary embodiment wherein a package substrate with a single semiconductor chip mounted thereon is shown due to a restriction in the size of the drawing. It will be understood, however, that the inventive concept may also be equally applied to the package substrate on which a plurality of semiconductor chips are mounted. In this case, the semiconductor package may be finally fabricated through a cutting process.

Figure 7A:
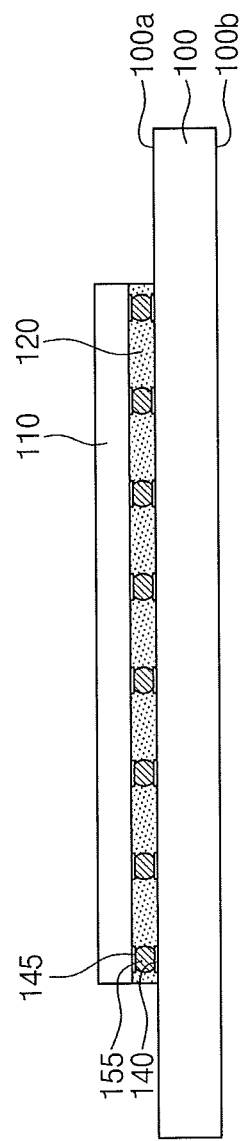
FIGS. 7A to 7E are schematic cross-sectional views of a semiconductor package sequentially representing a method of fabricating a semiconductor package according to another embodiment of the inventive concept.

Referring to FIG. 7A, a package substrate 100 on which a semiconductor chip 110 is mounted may be provided. Upper terminals 140 may be formed on a top surface 100a of the package substrate 100. The semiconductor chip 110 may be mounted so that the bottom surface thereof faces the top surface 100a of the package substrate 100. In the present embodiment, the semiconductor chip 110 has a center pad structure that may be flip-mounted on the package substrate 100. As another example, the semiconductor chip 110 may have an edge pad structure or a matrix pad structure. As an example, the semiconductor chip 110 may be a DRAM or flash memory element having the center pad structure. Chip connection terminals 145 may be disposed along the bottom surface of the semiconductor chip 110.

Connection members 155 may be placed between the upper terminals 140 and the chip connection terminals 145. Accordingly, the upper terminals 140 may be connected to the chip connection terminals 145 through the connection members 155, and furthermore, the package substrate 100 may be electrically connected to the semiconductor chip 110. As an example, the connection members 155 may be solder balls. An underfill resin layer 120 may be filled between the semiconductor chip 110 and the package substrate 100.

Figure 7B:
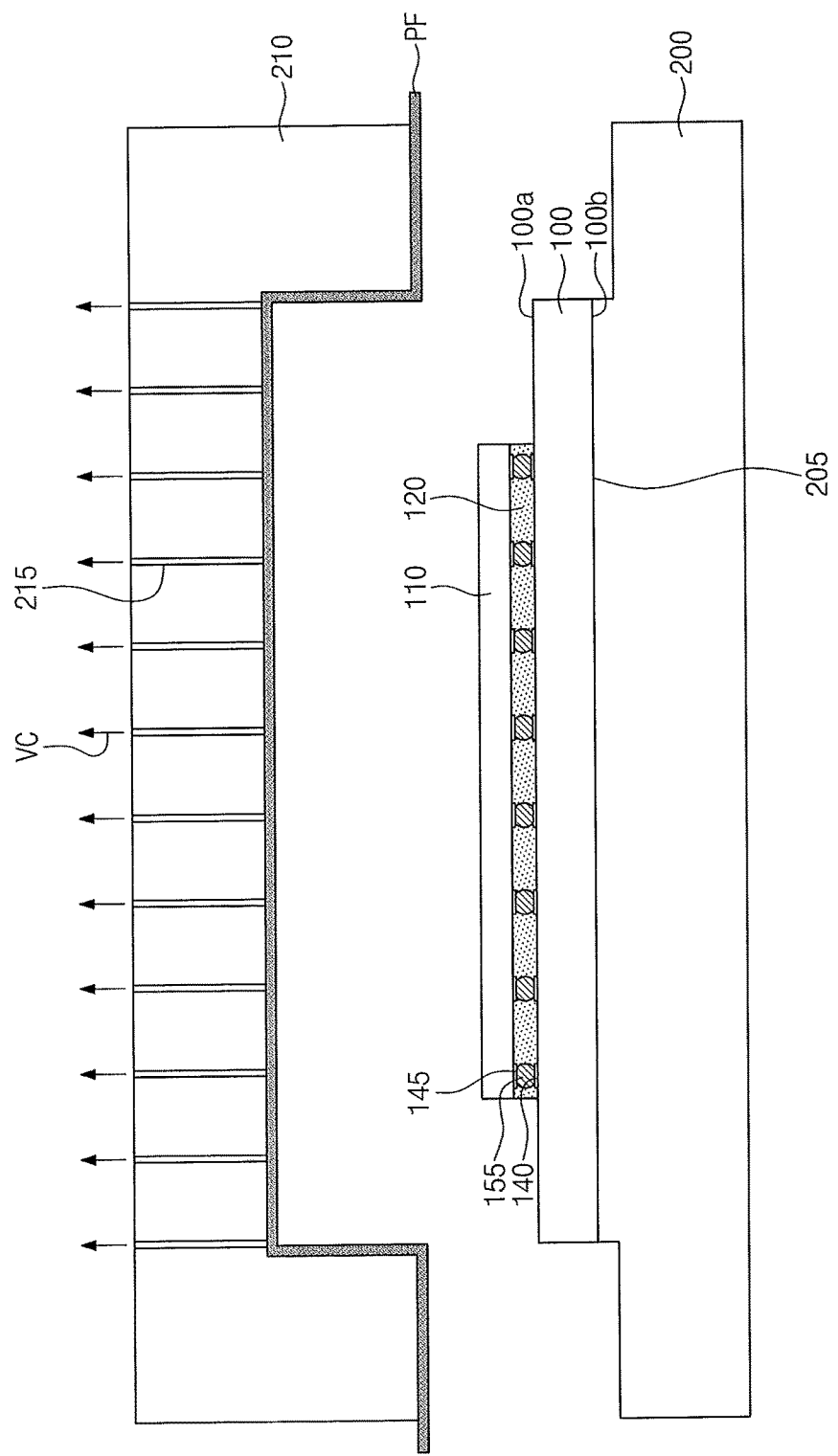

Referring to FIG. 7B, the package substrate 100 on which the semiconductor chip 110 is mounted may be provided on a lower mold 200. A package film PF may be provided under an upper mold 210. In particular, a vacuum VC may be applied to the upper mold 210 and the package film PF may surround an internal sidewall of the upper mold 210 by the vacuum VC.

Figure 7C:
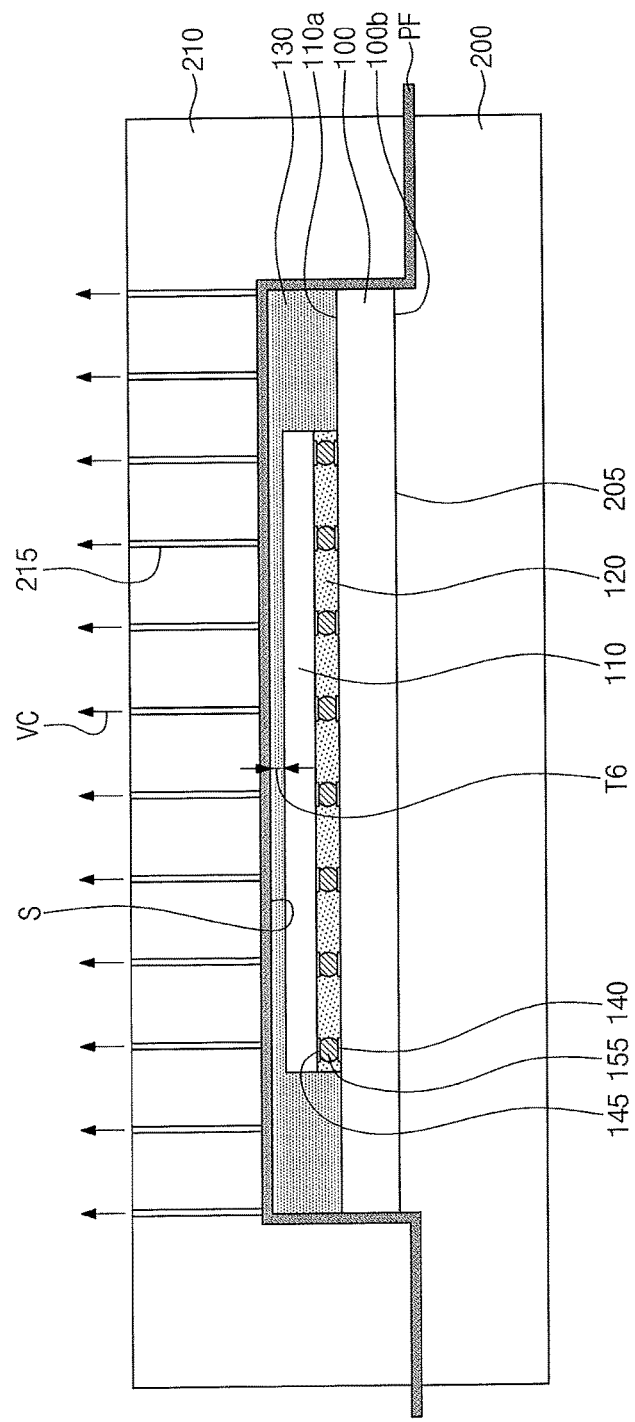

Referring to FIG. 7C, the upper mold 210 may be combined with the lower mold 200, and a molding layer 130 that covers the package substrate 100 and molds the semiconductor chip 110 may be formed. The molding layer 130 may be formed to have a sixth thickness T6. The sixth thickness T6 may be a distance from a top surface of the molding layer 130 to the top surface of the semiconductor chip 110 of about 1 μm to about 40 μm. That is, since the semiconductor package according to the present (FIGS. 7A to 7E) embodiment does not include the wires 150 (as seen in FIGS. 6C to 6E), the sixth thickness T6 may be smaller than the fifth thickness T5 described with reference to FIG. 6C.

Figure 7D:
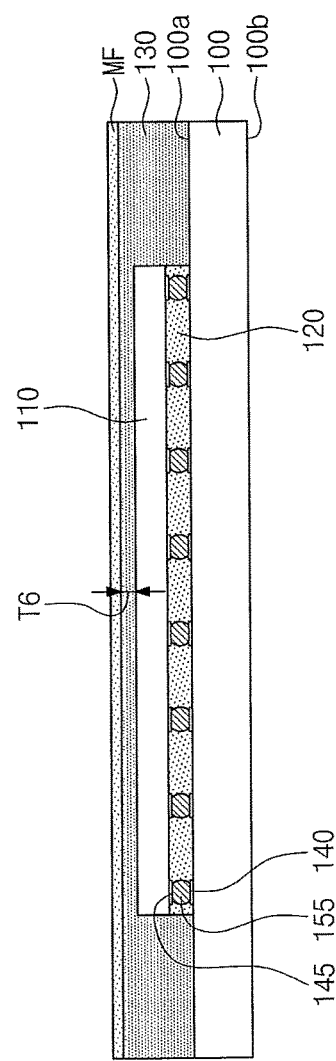

Referring to FIG. 7D, the upper mold 210 and the lower mold 200 (as seen in FIG. 7C) may be separated from the package substrate 100. The base film portion BF of the package film PF may be separated from the molding layer 130 simultaneously with the separation of the upper mold 210 (see FIG. 3B or FIG. 5B). Accordingly, the marking film MF may be formed on the molding layer 130.

Figure 7E:
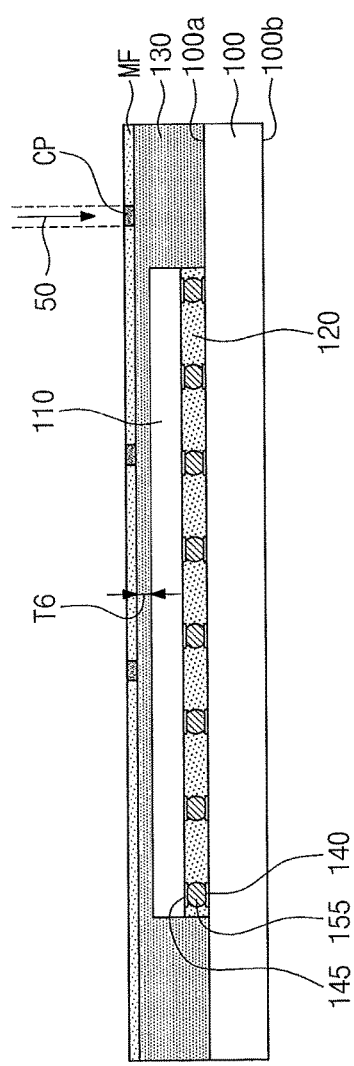

Referring to FIG. 7E, discoloration regions CP may be formed by irradiating a laser 50 onto the marking film MF. Although not shown, the discoloration regions CP may display information on the semiconductor package from a planar view.

FIG. 7E is a cross-sectional view of a semiconductor package according to another embodiment of the inventive concept. In the present (FIG. 7E) embodiment, detailed descriptions of technical characteristics that overlap those described with reference to FIG. 6E above are omitted and only differences are described in detail. The same reference numeral may be provided for the same components as those in the semiconductor package and for describing the inventive concept of the foregoing embodiment.

Referring to FIG. 7E, a semiconductor chip 110 may be mounted on a package substrate 100. A molding layer 130 may be disposed which covers the package substrate 100 and molds the semiconductor chip 110. An underfill resin layer 120 may be filled between the semiconductor chip 110 and the package substrate 100. Connection members 155 may electrically connect the package substrate 100 to the semiconductor chip 110. Detailed descriptions of the package substrate 100, the semiconductor chip 110, the underfill resin layer 120, and the connection members 155 may be the same as those described above with reference to FIG. 7A.

The molding layer 130 may be formed of EMC. The molding layer 130 may have a sixth thickness T6. In particular, the sixth thickness T6 may be a distance from a top surface of the molding layer 130 to a top surface of the semiconductor chip 110 of about 1 μm to about 40 μm.

A marking film MF may be disposed on the molding layer 130. The marking film MF may include discoloration regions CP which are formed by a laser 50 and which a user may identify.

Figure 8:
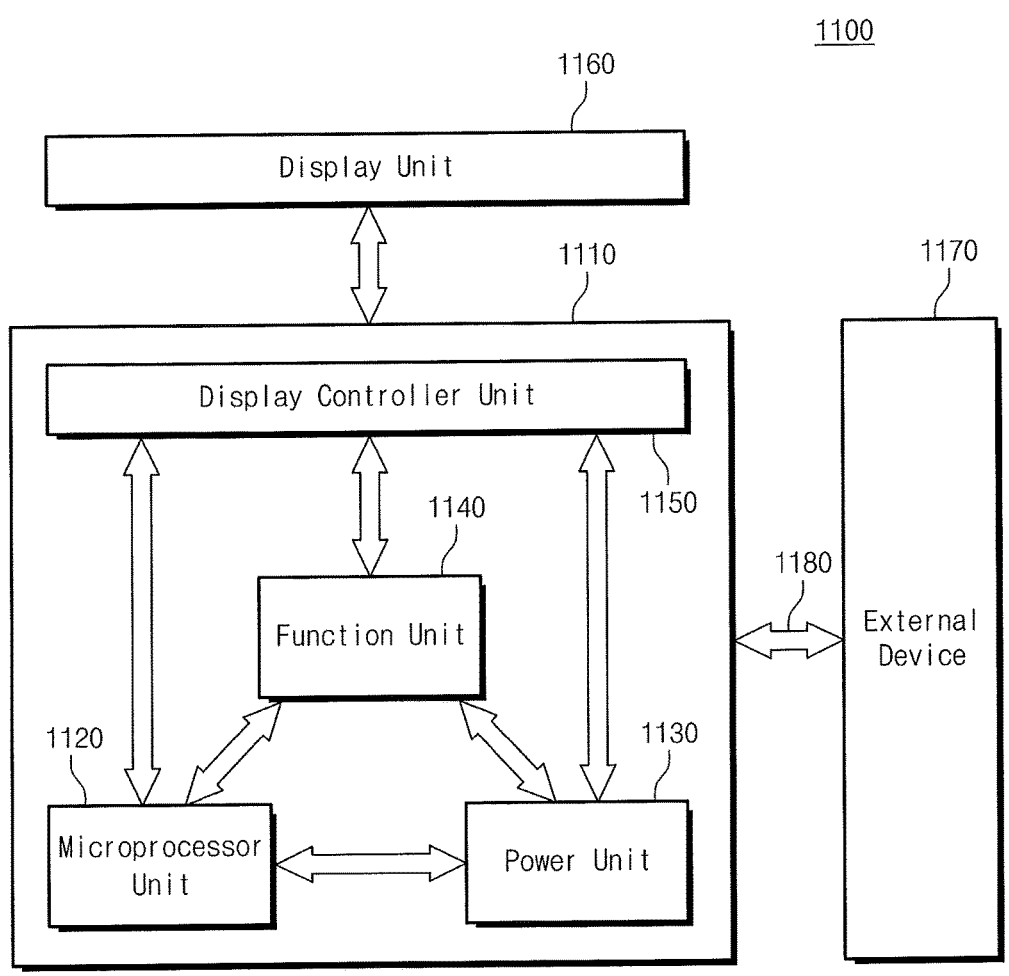
FIG. 8 is a block diagram of an electronic device to which a semiconductor package according to embodiments of the inventive concept is applied.

FIG. 8 is a block diagram of an electronic device to which a semiconductor package according to embodiments of the inventive concept is applied.

Referring to FIG. 8, a semiconductor package according to embodiments of the inventive concept may be applied to an electronic system 1100. The electronic system 1100 may include a body 1110, a microprocessor unit 1120, a power unit 1130, a function unit 1140, and a display controller unit 1150. The body 1110 may include therein a set board formed as a PCB; and the microprocessor unit 1120, the power unit 1130, the function unit 1140, and the display controller unit 1150 may be mounted on the body 1110.

The power unit 1130 receives a predetermined voltage from an external battery (not shown), divides the voltage into desired voltage levels and supplies the divided voltages to the microprocessor unit 1120, the function unit 1140 and the display controller unit 1150.

The microprocessor unit 1120 may receive a voltage from the power unit 1130 and control the function unit 1140 and a display unit 1160. The function unit 1140 may perform various functions for the electronic system 1100. For example, when the electronic system 1100 is a portable phone, the function unit 1140 may include various components to provide functions for a portable phone, such as dialing, displaying an image on the display unit 1160 through communication with the external device 1170, and outputting of voice through a speaker. When a camera is included together with the other components as part of the electronic system 1100, the function unit may be a camera image processor. For example, when the electronic system 1100 is connected to a memory card for expanding capacity, the function unit 1140 may be a memory card controller. The function unit 1140 may transmit and receive a signal to and from the external device 1170 through a wired or wireless communication unit 1180. For example, when the electronic system 1100 needs a universal serial bus (USB) for function expansion, the function unit 1140 may be an interface controller. The semiconductor package according to embodiments of the inventive concept may be used for at least one of the microprocessor unit 1120 and the function unit 1140.

Figure 9:
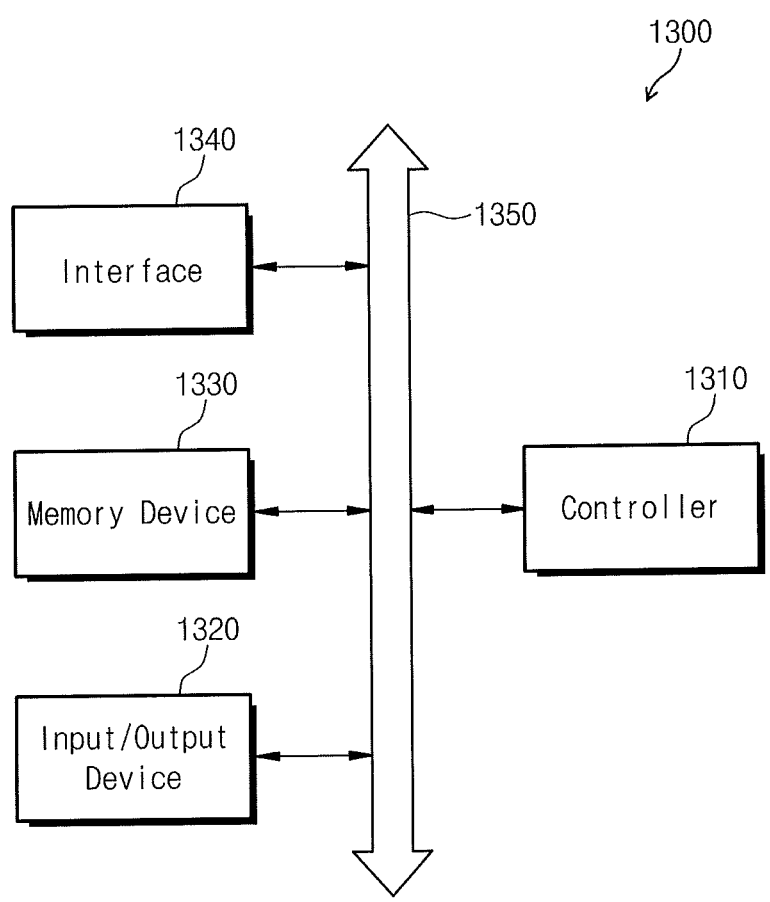
FIG. 9 is an exemplary block diagram of an electronic device including a semiconductor package according to embodiments of the inventive concept.

FIG. 9 is an exemplary block diagram of an electronic device including a semiconductor package according to embodiments of the inventive concept.

Referring to FIG. 9, an electronic system 1300 may include a controller 1310, an input/output device 1320 and a storage (memory) device 1330. The controller 1310, the input/output device 1320 and the storage device 1330 may be coupled through a bus 1350. The bus 1350 may be a path through which data moves. For example, the controller 1310 may include at least one of at least one microprocessor, a digital signal processor, a microcontroller, and logic elements that may perform the same functions as other components. The controller 1310 and/or the storage device 1330 may include a semiconductor package according to embodiments of the inventive concept. The input/output device 1320 may include at least one component selected from a key pad, a keyboard and a display device. The storage device 1330 is a device that stores data. The storage device 1330 may store data and or commands executed by the controller 1310. The storage device 1330 may include a volatile memory element and/or non-volatile memory element. Alternatively, the storage device 1330 may be formed as a flash memory. For example, the flash memory to which the inventive concept is applied may be installed at an information processing system such as a mobile device or a desktop computer. Such a flash memory may include a semiconductor disk device SSD. In this case, the electronic system 1300 may stably store massive quantities of data in the flash memory system. The electronic system 1300 may further include an interface 1340 for transmitting or receiving data to or from a communication network. The interface 1340 may be of a wired or wireless type. For example, the interface 1340 may include an antenna or a wired and wireless transceiver. Although not shown, it would be understood by a person skilled in the art that the electronic system 1300 may further include an application chipset and a camera image processor (CIP).

The semiconductor package according to the inventive concept may apply a marking film including a thermoreactive layer onto a molding layer, protect a semiconductor chip under the molding layer, and efficiently perform a marking process. Furthermore, the thickness of the molding layer may decrease and the entire thickness of the semiconductor package may further decrease. Also, it is possible to prevent the warpage of the semiconductor package through the marking film, provide the surface of the semiconductor package with gloss and freely adjust the color of the surface of the semiconductor package.

What is claimed is:

1. A semiconductor package comprising:
a semiconductor chip; and
a marking film on the semiconductor chip,
the marking film including a reflection layer for reflecting an electromagnetic wave,
the marking film including a thermoreactive layer on the reflection layer, and
the thermoreactive layer being configured to form a discoloration region in response to the electromagnetic wave.

2. The semiconductor package of claim 1, further comprising:
a molding layer between the semiconductor chip and the reflection layer.

3. The semiconductor package of claim 2, wherein
a distance between a top surface of the molding layer and a top surface of the semiconductor chip is in a range of about 1 µm to 40 µm.

4. The semiconductor package of claim 1,
wherein a thickness of the marking film is in a range between 5 µm and 40 µm.

5. The semiconductor package of claim 1, further comprising:
a base film on the marking film, wherein
the marking film is configured to separate from the base film to expose an upper surface of the marking film.

6. The semiconductor package of claim 5, wherein
the base film includes a release layer,
the release layer includes a release agent, and
the marking film is configured to separate from the release layer to expose the upper surface of the marking film.

7. The semiconductor package of claim 6, wherein
the release agent of the release layer is a silicone release agent, an epoxy release agent, or a fluorine release agent.

8. The semiconductor package of claim 6, wherein
the base film further includes a base layer on the release layer.

9. The semiconductor package of claim 5, wherein
the base film includes a base layer, and
the base layer has a releasing property.

10. The semiconductor package of claim 1, wherein
the reflection layer includes a reflection material for reflecting the electromagnetic wave, and
the reflection material includes at least one of $Sb_2O_3$, $BaSO_4$, $(PbCO_3)_2Pb(OH)_2$, $TiO_2$, $ZnO$, $ZnS$, $Al_2O_3$, or a combination thereof.

11. The semiconductor package of claim 1, wherein
the thermoreactive layer includes a light absorber and at least one of a discoloration material or a carbonization material.

12. The semiconductor package of claim 11, wherein
the light absorber includes one of carbon black, titanium black, $Fe_3O_4$, and mordant black.

13. The semiconductor package of claim 11, wherein
the thermoreactive layer includes the discoloration material, and
the discoloration material includes one of thermochromic material, photochromic material, ionochromic material, electrochromic material, solvatochromic material, piezochromic material, gasochromic material, vapochromic material or chronochromic material.

14. The semiconductor package of claim 11, wherein
the thermoreactive layer includes the carbonization material, and
the carbonization material includes one of acrylic, phenolic, epoxy, urethane, polyamide or polyolefin.

15. The semiconductor package of claim 1, wherein
the reflection layer and the thermoreactive layer include a thermosetting resin.

16. The semiconductor package of claim 1, wherein
the thermoreactive layer includes a dye.

17. The semiconductor package of claim 1, wherein
the semiconductor chip includes a memory element.

18. The semiconductor package of claim 1, wherein
the semiconductor chip includes a non-memory element.

19. The semiconductor package of claim 1, further comprising:

connection terminals connected to a bottom surface of the semiconductor chip, wherein
the marking film is on a top surface of the semiconductor chip.

* * * * *